(12) United States Patent
Sugiyama

(10) Patent No.: US 8,415,862 B2
(45) Date of Patent: Apr. 9, 2013

(54) PIEZOELECTRIC VIBRATOR, PIEZOELECTRIC VIBRATOR MOUNTING BODY, AND PIEZOELECTRIC VIBRATOR MANUFACTURING METHOD

(75) Inventor: Takeshi Sugiyama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 13/196,356

(22) Filed: Aug. 2, 2011

(65) Prior Publication Data

US 2011/0285250 A1 Nov. 24, 2011

Related U.S. Application Data

(63) Continuation of application No. PCT/JP2009/053327, filed on Feb. 25, 2009.

(51) Int. Cl.
*H01L 41/08* (2006.01)
(52) U.S. Cl.
USPC ........................................................ 310/344
(58) Field of Classification Search ................... 310/340, 310/344, 348
See application file for complete search history.

(56) References Cited

U.S. PATENT DOCUMENTS

| | | | | |
|---|---|---|---|---|
| 7,531,945 B2 * | 5/2009 | Aratake | ......................... | 310/344 |
| 7,932,662 B2 * | 4/2011 | Saito | ............................. | 310/344 |
| 8,032,997 B2 * | 10/2011 | Numata et al. | ................ | 29/25.35 |
| 8,069,543 B2 * | 12/2011 | Numata et al. | ................ | 29/25.35 |

FOREIGN PATENT DOCUMENTS

| | | |
|---|---|---|
| JP | 06-283951 A | 10/1994 |
| JP | 08-125063 A | 5/1996 |
| JP | 09-237802 A | 9/1997 |
| JP | 2004-214787 A | 7/2004 |

OTHER PUBLICATIONS

International Search Report for International Application No. PCT/JP2009/053327, dated May 19, 2009, 1 page.

* cited by examiner

*Primary Examiner* — Mark Budd
(74) *Attorney, Agent, or Firm* — Brinks Hofer Gilson & Lione

(57) ABSTRACT

This piezoelectric vibrator is provided with a package that is structured to include a first substrate and a second substrate that are bonded to each other such that a cavity is formed therebetween, an internal electrode portion that is formed on the first substrate and housed in the cavity, a piezoelectric vibrating reed that is sealed in the cavity and also is electrically connected to the internal electrode portion in the cavity, an external electrode portion that is formed on an external surface of the first substrate, a through electrode portion that is disposed so as not to be overlapped by the external electrode portion in a thickness direction of the first substrate, while one end of the through electrode portion is electrically connected to the internal electrode portion and another end of the through electrode portion is formed on the external surface of the first substrate while penetrating through the first substrate, and a routing wiring portion that electrically connects the through electrode portion and the external electrode portion.

9 Claims, 5 Drawing Sheets

PIEZOELECTRIC VIBRATOR, PIEZOELECTRIC VIBRATOR MOUNTING BODY, AND PIEZOELECTRIC VIBRATOR MANUFACTURING METHOD

RELATED APPLICATIONS

This application is a continuation of PCT/JP2009/053327 filed on Feb. 25, 2009. The entire content of this application is incorporated herein by reference.

BACKGROUND OF THE INVENTION

1. Field of the Invention

The present invention relates to a piezoelectric vibrator, a piezoelectric vibrator mounting body and a piezoelectric vibrator manufacturing method.

2. Description of the Related Art

In recent years, mobile telephones and portable information terminal devices employ a piezoelectric vibrator that uses crystal or the like as a time source, a timing source of control signals or the like, and a reference signal source etc. Various examples of this type of piezoelectric vibrator are known. One known example is a surface mount device type piezoelectric vibrator. As this type of piezoelectric vibrator, a three-layer structure type is generally known in which a piezoelectric substrate that has a piezoelectric vibrating reed formed thereon is bonded through being sandwiched by a base substrate and a lid substrate from above and below. In this case, the piezoelectric vibrating reed is housed in a cavity (a sealed chamber) that is formed between the base substrate and the lid substrate.

Further, in recent years, not only the above-described three-layer structure type piezoelectric vibrator, but also a two-layer structure type piezoelectric vibrator has been developed. This type of piezoelectric vibrator has a two-layer structure in which a base substrate and a lid substrate are directly bonded to each other, and a piezoelectric vibrating reed is housed in a cavity formed between the two substrates. The two-layer structure type piezoelectric vibrator is excellent in that it can be made thinner as compared with the piezoelectric vibrator having the three-layer structure, and is therefore preferably used.

As this type of piezoelectric vibrator, as disclosed in Patent Document 1 mentioned below, a structure is known in which a through hole is provided in a substrate (a base substrate) made of glass or ceramic, a wiring metal is formed on an inner surface of the through hole and upper and lower surfaces of a periphery of the through hole or on either one of the sections, an alloy is melted and welded to the through hole to cause the through hole to become an airtight terminal, and a crystal element (a piezoelectric vibrating reed) provided on a substrate surface is electrically connected to the alloy of the airtight terminal portion directly or via the wiring metal provided on the substrate surface. With this structure, it is considered possible to apply a predetermined driving voltage to the piezoelectric vibrating reed from outside the piezoelectric vibrator via the airtight terminal, namely, via a through electrode portion that is an electrode formed so as to penetrate through the substrate.

Generally, the piezoelectric vibrator has a structure with a positional relationship in which the through electrode portion is overlapped with the base substrate in a thickness direction while being sandwiched between the above-described wiring metals. This makes it easier to perform routing of a wiring electrode by connecting the wiring metal exposed to the outside of the piezoelectric vibrator (an external electrode portion) and the wiring metal exposed in the cavity (an internal electrode portion) through a shortest path.

Patent Document 1: JP-A-6-283951

However, with the piezoelectric vibrator and a piezoelectric vibrator manufacturing method disclosed in Patent Document 1, since the through electrode portion and the external electrode portion have the positional relationship in which the through electrode portion and the external electrode portion are overlapped with each other in the thickness direction of the base substrate, in a case in which the piezoelectric vibrator is mounted on a wiring substrate, bending stress applied to the piezoelectric vibrator is concentrated on the through electrode portion when the bending stress arises in the wiring substrate. At this time, the stress concentrated on the through electrode portion may cause a crack in a connecting part between the through hole and the through electrode portion. As a result, outside air circulates in the cavity, and this causes a problem in which a quality of the piezoelectric vibrator is affected.

The invention is made in light of the above-described problem, and it is an object thereof to provide a piezoelectric vibrator that has high mechanical strength when it is mounted on a wiring substrate.

SUMMARY OF THE INVENTION

In order to solve the above-described problem, the invention proposes means described below.

A piezoelectric vibrator of the invention is characterized by being provided with: a package that is structured to include a first substrate and a second substrate that are bonded to each other such that a cavity is formed therebetween; an internal electrode portion that is formed on the first substrate and housed in the cavity; a piezoelectric vibrating reed that is sealed in the cavity and is also electrically connected to the internal electrode portion in the cavity; an external electrode portion that is formed on an external surface of the first substrate; a through electrode portion that is disposed so as not to be overlapped by the external electrode portion in a thickness direction of the first substrate, one end of the through electrode portion being electrically connected to the internal electrode portion and another end of the through electrode portion being formed on the external surface of the first substrate while penetrating through the first substrate; and a routing wiring portion that electrically connects the through electrode portion and the external electrode portion.

According to the invention, with respect to a relative positional relationship between the external electrode portion and the through electrode portion, the through electrode portion is positioned such that it is not overlapped by the external electrode portion in the thickness direction of the first substrate. Then, the external electrode portion and the through electrode portion are electrically connected by the routing wiring portion. Therefore, when bending stress arises in the external electrode portion, the bending stress transmitted to the through electrode portion is reduced, thus favorably inhibiting a crack in the through electrode portion.

Further, it is preferable that the piezoelectric vibrator of the invention is provided with a plurality of the external electrode portions and the through electrode portion is disposed between the plurality of external electrode portions.

In this case, when the bending stress arises in the first substrate in the external electrode portion, the bending stress is smaller in areas between the plurality of external electrode portions than in areas of the external electrode portions on the first substrate, since the first substrate is twisted less in the areas between the plurality of external electrode portions than in the areas of the external electrode portions. Therefore, it is possible to inhibit the crack from occurring in a connecting part between the first substrate and the through electrode portion.

Further, in the piezoelectric vibrator of the invention, it is preferable that a stepped portion is provided between the external electrode portion and the routing wiring portion and a maximum dimension in the thickness direction of the first substrate in the external electrode portion is larger than a maximum dimension in the thickness direction of the first substrate in the routing wiring portion.

In this case, the external electrode portion protrudes more than the routing wiring portion. Therefore, when the external electrode portion is connected to other surface-form electrical contacts using solder, the solder remains on the side of the external electrode portion with the stepped portion acting as a boundary and the solder is inhibited from leaking into the routing wiring portion beyond the stepped portion. Hence, the bending stress on the external electrode portion is inhibited from being transmitted to the through electrode portion via the solder.

Further, in the piezoelectric vibrator of the invention, it is preferable that a high affinity portion that has an affinity for solder is provided on a surface of the external electrode portion and a low affinity portion that has lower affinity for the solder than the high affinity portion is provided on a surface of the routing wiring portion.

In this case, the high affinity portion has improved electrical connectivity with the above-described other electrical contacts, while it is unlikely for the solder to attach to the low affinity portion. Therefore, the bending stress on the external electrode portion is inhibited from being transmitted to the through electrode portion side via the solder. As a result, it is possible to mount the piezoelectric vibrator without a need for stringent controls to ensure that the solder is not attached to the routing wiring portion.

Further, it is preferable that the piezoelectric vibrator of the invention includes: a chromium layer which is provided on the first substrate and disposed so as to include areas of the external electrode portion and the routing wiring portion, and which contains chromium and functions as the low affinity portion; and a gold layer which is further layered over the chromium layer in the area of the external electrode portion, and which contains gold and functions as the high affinity portion.

In this case, the chromium layer is disposed on a bottom layer side of the external electrode portion, and the gold layer is disposed on an upper layer of the external electrode portion. Therefore, since a contact area between the chromium layer and the gold layer is large, even when a dissimilar metal is used, an electrical connection can be made in a reliable manner. Further, since the external electrode portion and the routing wiring portion are formed by laminating the gold layer on the chromium layer, the low affinity portion and the high affinity portion can be formed easily.

A piezoelectric vibrator mounting body according to the invention is characterized by being provided with the piezoelectric vibrator of the invention and a wiring substrate that includes a land which is electrically connected to the external electrode portion. The piezoelectric vibrator mounting body is also characterized in that a surface area of the external electrode portion is smaller than a surface area of the land.

According to the invention, since the surface area of the external electrode portion is smaller than the surface area of the land, when the piezoelectric vibrator is mounted on the wiring substrate by disposing a molten matter of the solder between the land and the external electrode portion, the external electrode portion moves to a position closer to the center of the land. Therefore, positioning becomes easier when the piezoelectric vibrator is mounted on the wiring substrate.

A piezoelectric vibrator manufacturing method according to the invention is characterized by being provided with: a first step of forming a bottom layer of an external electrode portion and forming a routing wiring portion by laminating a first layer containing a first metal; and a second step of forming an upper layer of the external electrode portion by laminating a second layer containing a second metal on a surface of the bottom layer of the external electrode portion, the second metal having higher affinity with solder than the first metal.

According to the invention, since the routing wiring portion and the bottom layer of the external electrode portion are integrally formed by the first metal, electrical resistance can be reduced. Further, since the second layer that is laminated on the surface of the bottom layer of the external electrode portion has a high affinity for the solder, a connection by solder can be performed in a reliable manner.

According to the piezoelectric vibrator, the piezoelectric vibrator mounting body and the piezoelectric vibrator manufacturing method according to the invention, since the external electrode portion and the through electrode portion are disposed in separate areas such that they are not overlapped with each other in the thickness direction of the first substrate, a concentration of stress generated in the through electrode portion via the external electrode portion is favorably reduced, and it is possible to increase mechanical strength of the piezoelectric vibrator, when the piezoelectric vibrator is mounted on the wiring substrate etc. Further, since it is possible to increase the mechanical strength of the piezoelectric vibrator when it is mounted on the wiring substrate etc., the piezoelectric vibrating reed inside the piezoelectric vibrator is sealed airtightly and it is possible to maintain quality of the piezoelectric vibrator provided in the piezoelectric vibrator mounting body.

DETAILED DESCRIPTION OF THE PREFERRED EMBODIMENTS

First Embodiment

Hereinafter, a piezoelectric vibrator and a piezoelectric vibrator mounting body according to a first embodiment of the invention will be described with reference to FIG. 1 to FIG. 4.

Figure 1A:
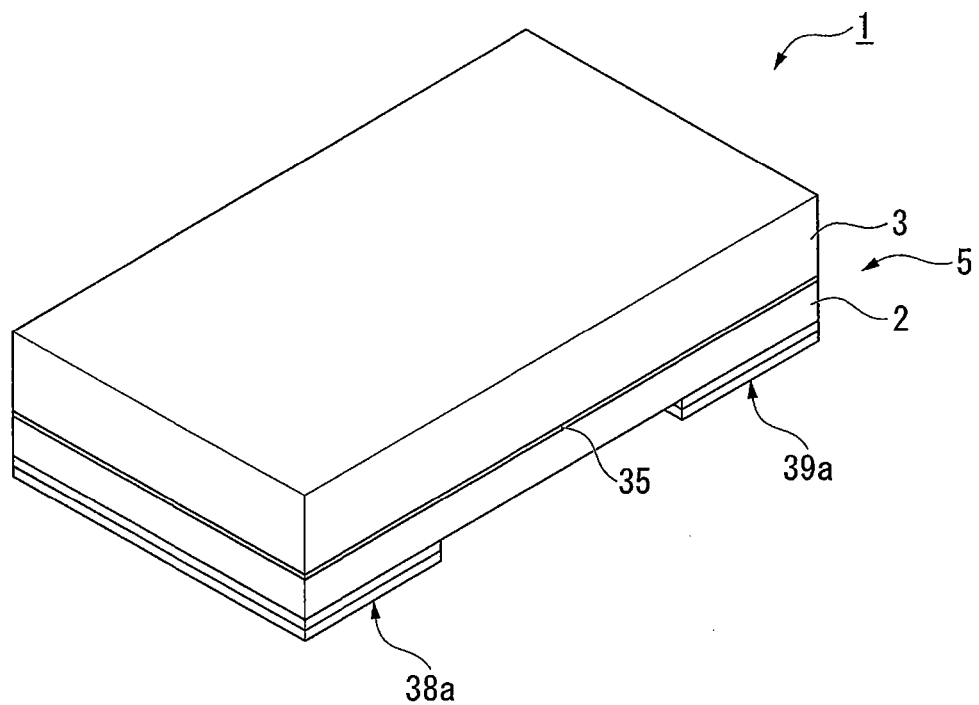
FIG. 1A is a perspective view showing a piezoelectric vibrator according to a first embodiment of the invention.

FIG. 1 is a perspective view showing a piezoelectric vibrator 1. As shown in FIG. 1(A), in the piezoelectric vibrator 1, a box-shaped package 5 is formed by being laminated with two layers, the two layers being a base substrate (a first substrate) 2 and a lid substrate (a second substrate) 3. The base substrate 2 and the lid substrate 3 are transparent insulating substrates made of a glass material such as soda lime glass, for example, and are formed in a board form having sizes with which the two substrates can be superimposed on each other. Further, a bonding film 35 is interposed between the base substrate 2 and the lid substrate 3 such that the base substrate 2 and the lid substrate 3 are bonded airtightly.

Figure 1B:
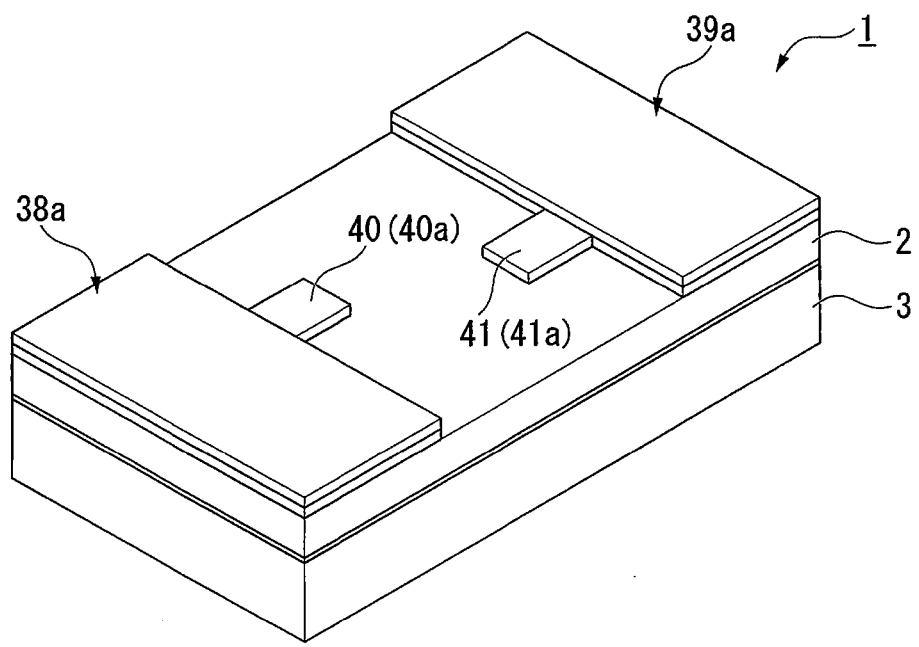
FIG. 1B is a perspective view showing the piezoelectric vibrator.

As shown in FIG. 1(A) and FIG. 1(B), two external electrode portions 38a, 38b are provided on an external surface of the base substrate 2, the external electrode portions 38a, 38b being disposed apart at both ends of the base substrate 2 in a lengthwise direction. Further, in the base substrate 2, routing wiring portions 40a, 41a are formed that extend toward a point between the external electrode portions 38a, 38b along the external surface of the base substrate 2.

Figure 2A:
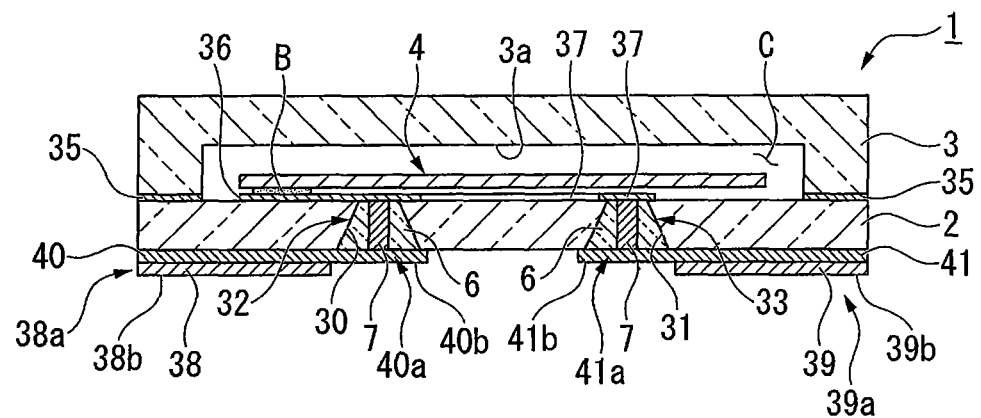
FIG. 2A is a cross-sectional side view of the piezoelectric vibrator.

FIG. 2 is a cross-sectional side view of the piezoelectric vibrator 1. As shown in FIG. 2(A), a recessed portion 3a is formed in the lid substrate 3, and a cavity C is formed between the base substrate 2 and the lid substrate 3. Inside the cavity C, internal electrode portions 36, 37 that are formed on the base substrate 2 and a piezoelectric vibrating reed 4 that is electrically connected to the internal electrode portions 36, 37 are housed. Note that a metal bump B is used to connect the internal electrode portions 36, 37 and the piezoelectric vibrating reed 4. A material having electrical conductivity, such as solder, gold or the like, can be used as the metal bump B.

Further, through electrode portions 32, 33 are provided in the base substrate 2, the through electrode portions 32, 33 being disposed penetrating through the base substrate 2 in a thickness direction thereof. One end of each of the through electrode portions 32, 33 is electrically connected to each of the internal electrode portions 36, 37 respectively, and the other ends are electrically connected to the routing wiring portions 40a, 41a that are formed on the external surface of the base substrate 2.

Figure 2B:
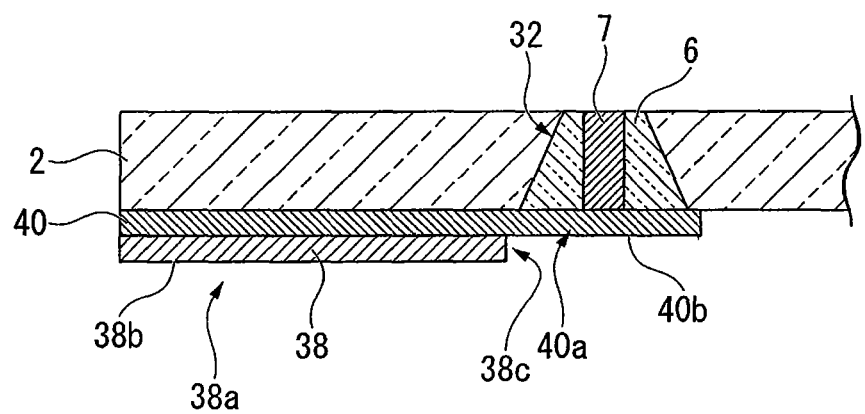
FIG. 2B is a cross-sectional side view showing an enlarged part of the piezoelectric vibrator.

FIG. 2(B) is a cross-sectional side view showing an enlarged part of the piezoelectric vibrator 1. As shown in FIG. 2(B), the external electrode portion 38a provided on the base substrate 2 has a two-layer structure and includes a first layer 40 (a lower layer) that is formed on the base substrate 2 and is an integral part of the routing wiring portion 40a, and a second layer 38 (an upper layer) that is formed by being laminated over the first layer 40. Therefore, a stepped portion 38c is formed between the routing wiring portion 40a and the external electrode portion 38a. A structure can be adopted in which the stepped portion 38c has an end face that is roughly parallel to the base substrate 2 in the thickness direction, but the end face may also be inclined.

The through electrode portion 32 has conductive core portions 7 inside through holes 30, 31 that penetrate through the base substrate 2 in the thickness direction and cases 6 that are filled around the core portions 7. In the embodiment, the through holes 30, 31 are formed as hole portions having a truncated cone shape with the inner diameter becoming smaller toward the cavity C side of the base substrate 2. The cases 6 support the core portions 7 and at the same time seal the through holes 30, 31. The cases 6 can be formed by firing a glass frit in a paste form, for example.

Further, the through electrode portion 32 is disposed such that it is not overlapped by the external electrode portion 38a in the thickness direction of the base substrate 2 and is also disposed closer to a central part of the base substrate 2 in the lengthwise direction than to the external electrode portion 38a that is disposed at an end portion of the base substrate 2.

Note that, with respect to a positional relationship of the through electrode portion 33 also, similarly to the above-described positional relationship of the through electrode portion 32, the through electrode portion 33 is positioned such that it is not overlapped by the external electrode portion 39a in the thickness direction of the base substrate 2.

Further, the external electrode portions 38a, 38b include high affinity portions 38b, 39b that have affinity for solder and that are connected to a land such as a wiring substrate etc. when the piezoelectric vibrator 1 is mounted on the wiring substrate etc. On the other hand, the routing wiring portions 40a, 41a include low affinity portions 40b, 41b that have a relatively lower affinity for solder compared with the high affinity portions 38b, 39b.

In the embodiment, of the external electrode portions 38a, 38b, at least the high affinity portions 38b, 39b are gold layers containing gold that have high electrical conductivity, high corrosion resistance and also high affinity for solder. On the other hand, of the routing wiring portions 40a, 41a, at least the low affinity portions 40b, 41b are chromium layers containing chromium that have high electrical conductivity and also a tendency to repel solder due to an interfacial tension that arises between the solder and the chromium layers.

Figure 3:
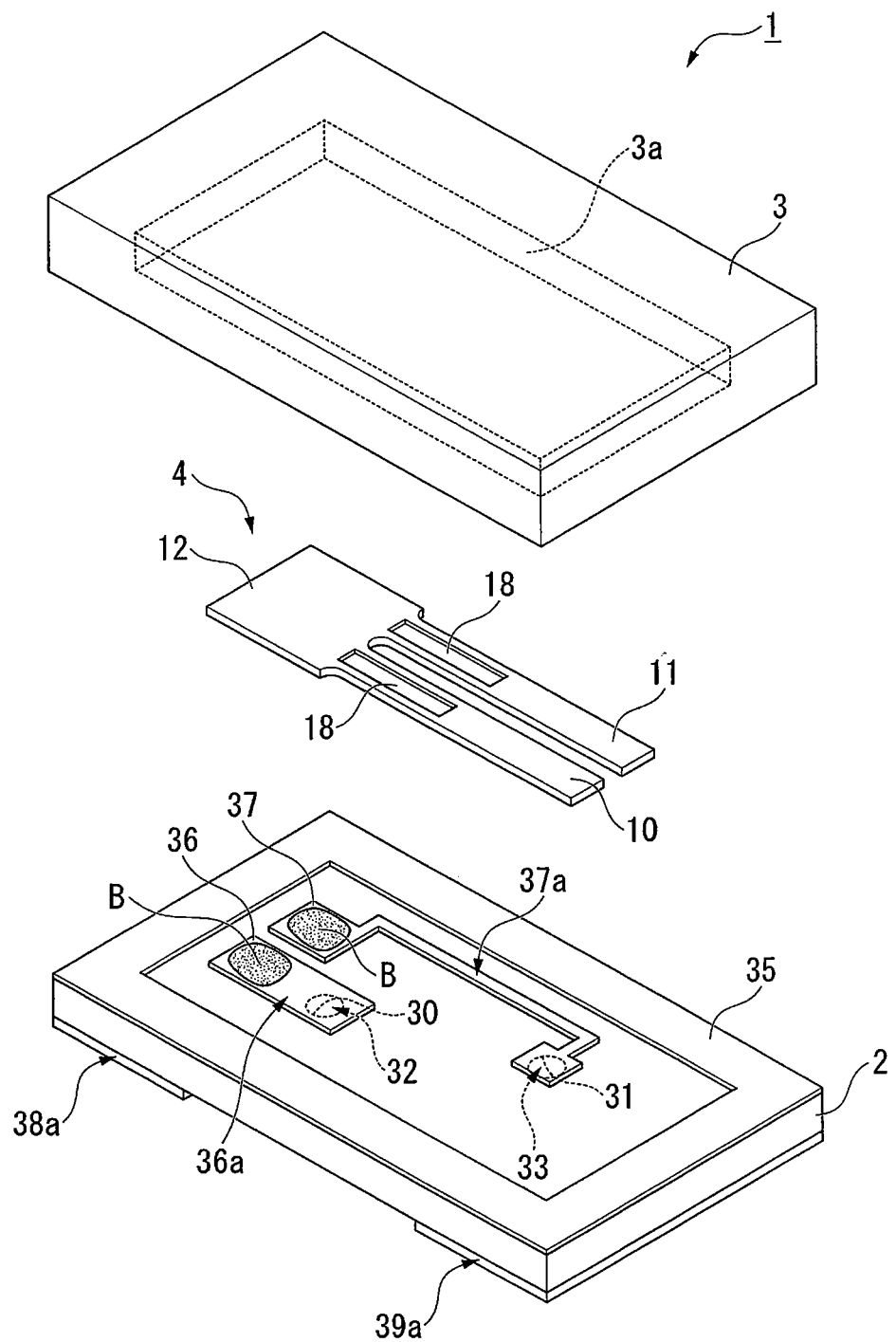
FIG. 3 is an exploded perspective view showing the piezoelectric vibrator.

FIG. 3 is an exploded perspective view showing the piezoelectric vibrator 1. As shown in FIG. 3, on the base substrate 2, the internal electrode portions 36, 37 are connected respectively to the through electrode portions 32, 33 through routing wiring portions 36a, 37a along the base substrate 2. The piezoelectric vibrating reed 4 is a tuning-fork type vibrating reed formed of a piezoelectric material, such as crystal, lithium tantalate, lithium niobate or the like, and it vibrates when a predetermined voltage is applied.

The piezoelectric vibrating reed 4 has a pair of vibrating arm portions 10, 11 that are disposed parallel to each other and a base portion 12 that integrally fixes a base end side of the pair of vibrating arm portions 10, 11.

Further, the piezoelectric vibrating reed 4 of the embodiment includes groove portions 18 that are respectively formed on both principal surfaces of the pair of vibrating arm portions 10, 11 along a longitudinal direction of the vibrating arm portions 10, 11. The groove portions 18 are formed from the base end side to substantially the middle of the vibrating arm portions 10, 11. The groove portions 18 are provided to further improve vibration characteristics by further reducing vibration loss of the piezoelectric vibrating reed 4.

Figure 4:
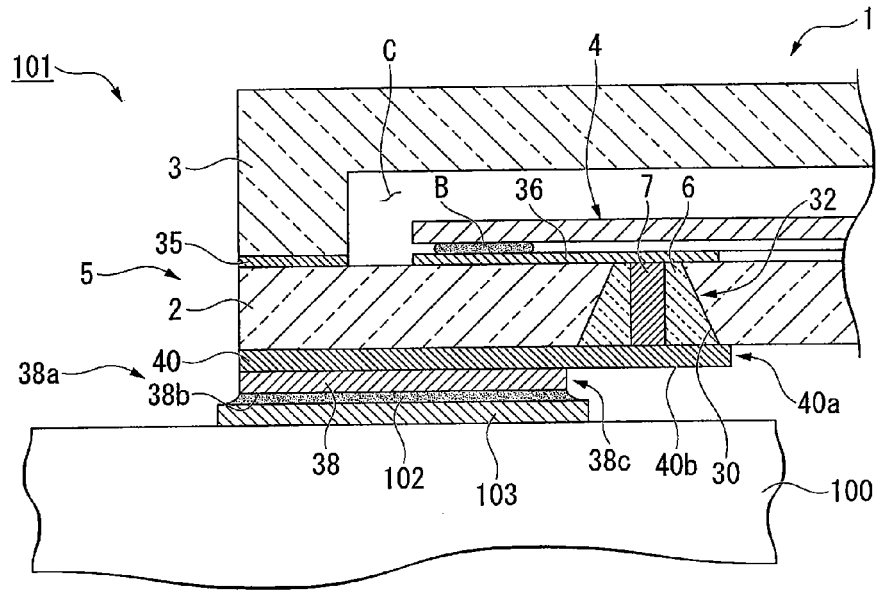
FIG. 4 is a side view showing a partial cross section of a piezoelectric vibrator mounting body according to the invention.

FIG. 4 is a side view showing a partial cross section of part of a structure of a piezoelectric vibrator mounting body 101 on which the piezoelectric vibrator 1 is mounted. As shown in FIG. 4, the above-described piezoelectric vibrator 1 is mounted by connecting the external electrode portions 38a, 38b to a land (for example, a land 103) that is provided on a surface of a wiring substrate 100. An appropriate structure that has electrical conductivity, such as a structure formed of common thin copper, can be preferably adopted as the land 103.

Further, a solder 102 is interposed between the external electrode portion 38a and the land 103, the solder 102 being adhered respectively to the high affinity portion 38b of the external electrode portion 38a and a surface of the land 103. Further, a surface area of the external electrode portion 38a is designed to be smaller than a surface area of the land 103.

The piezoelectric vibrator and the piezoelectric vibrator mounting body and operations according to the embodiment with the above-described structures will be explained with reference to FIG. 4.

As shown in FIG. 4, in a state in which the piezoelectric vibrator 1 is mounted on the wiring substrate 100, the external electrode portion 38a of the piezoelectric vibrator 1 is integrally connected to the land 103 by the solder 102.

Further, the solder 102 is spread over an entire area of the high affinity portion 38b and as far as the stepped portion 38c, but the solder 102 is repelled in the low affinity portion 40b that has low affinity with the solder 102. Therefore, the solder 102 is not attached to the routing wiring portion 40a that includes the low affinity portion 40b.

Here, for example, when an external force is applied to the wiring substrate 100, the wiring substrate 100 is warped, and as a result the external electrode portion 38a (39a) is also warped. Further, with respect to the base substrate 2, in an area of the external electrode portion 38a (39a), bending stress arises due to the above-described external force. At this time, in the base substrate 2, an area in which the external electrode portion 38a (39a) is disposed has the highest bending stress. Meanwhile, outside the area of the external electrode portion 38a (39a), an area that is not overlapped by the external electrode portion 38a (39a) in the thickness direction of the base substrate 2 has a relatively low bending stress. Therefore, in a vicinity of the through electrode portion 32 (33) which is disposed in the area with the relatively low bending stress, a lower bending stress is transmitted than the bending stress arising in the external electrode portion 38a (39a).

Further, since the wiring substrate 100 and the routing wiring portion 40a (41a) are separated from each other at least by the stepped portion 38c, contact between the wiring substrate 100 and the routing wiring portion 40a (41a) is inhibited.

Since the through electrode portion 32 (33) contains a material different from that of the base substrate 2, there exists an interface in a connecting part therebetween. Therefore, an area of the through electrode portion 32 (33) has a lower mechanical strength with respect to the bending stress compared with other areas of the base substrate 2. In general, when the base substrate is warped in a way that causes the through electrode portion to be warped, there is a possibility that a crack occurs in the through electrode portion as the bending stress is concentrated therein. As a result, a gap is created that causes communication between an outside of the package 5 and the cavity C, and the airtightness in the cavity C is no longer maintained. When the cavity C is not airtight in this way, there is a possibility that a quality of the piezoelectric vibrator is changed by the influence of external air.

According to the piezoelectric vibrator 1 and the piezoelectric vibrator mounting body 101 of the embodiment, the through electrode portion 32 (33) are disposed in areas outside of the external electrode portions 38a, 38b. As described above, bending stress is relatively low in these areas. Since the external electrode portions and the through electrode portions are disposed separately in this manner to prevent them from being overlapped with each other in the thickness direction of the base substrate 2, a concentration of the stress that arises in the through electrode portions 32, 33 via the external electrode portions 38a, 38b is favorably suppressed, and it is possible to improve the mechanical strength of the piezoelectric vibrator when the piezoelectric vibrator is mounted on the wiring substrate etc.

In addition, since it is possible to improve the mechanical strength of the piezoelectric vibrator 1 when it is mounted on the wiring substrate 100, the piezoelectric vibrating reed 4 inside the piezoelectric vibrator 1 is sealed airtightly and it is possible to maintain the quality of the piezoelectric vibrator provided in the piezoelectric vibrator mounting body.

Further, since the through electrode portions 32, 33 are disposed in the central part of the base substrate 2 in the lengthwise direction, in which the bending stress is relatively low when the base substrate 2 is warped, the bending stress transmitted to the through electrode portions 32, 33 is favorably reduced and it is possible to inhibit the crack from occurring in the connecting part between the base substrate and the through electrode portions.

Further, the external electrode portion 38a protrudes from the routing wiring portion 40a to the extent of the stepped portion 38c. Therefore, when the external electrode portion 38a is connected to other surface-form electrical contacts using the solder 102, the solder 102 remains on the side of the external electrode portion 38a with the stepped portion 38c acting as a boundary, and the solder 102 is inhibited from leaking into the routing wiring portion 40a beyond the stepped portion 38c. Hence, the bending stress on the external electrode portions is inhibited from being transmitted to the through electrode portions via the solder.

Further, since the stepped portion 38c is provided, when the piezoelectric vibrator 1 is mounted on the wiring substrate 100, a gap arises between the wiring substrate 100 and the routing wiring portion 40a. Therefore, also when the wiring substrate 100 is warped, the wiring substrate 100 and the routing wiring portion 40a are inhibited from making direct contact with each other. As a result, when the wiring substrate is warped, it is possible to inhibit the bending stress from being directly transmitted to the through electrode portions.

Further, since the external electrode portion 38a is formed to be smaller than the land 103, when the piezoelectric vibrator 1 is mounted on the wiring substrate 100 by disposing a molten matter of the solder 102 between the land 103 and the external electrode portion 38a, the external electrode portions 38a, 39a are moved to positions closer to the center of the land on the molten solder 102. Therefore, positioning becomes easier when the piezoelectric vibrator is mounted on the wiring substrate.

Note that, in order to reduce the bending stress on the through electrode portions 32, 33, it is preferable that the through electrode portions 32, 33 are disposed away from both the external electrode portions 38a, 38b. When the through electrode portions 32, 33 are disposed at the center of the external electrode portions 38a, 38b in the lengthwise direction on the base substrate, it is possible to reduce the bending stress that arises on the through electrode portions 32, 33.

Second Embodiment

Next, a piezoelectric vibrator mounting body according to a second embodiment of the invention will be explained with reference to FIG. 5. Note that in respective embodiments described below, descriptions will be omitted for portions that have common structures with the above-described piezoelectric vibrator 1 and the piezoelectric vibrator mounting body 101 according to the first embodiment, while using the same reference numerals and signs as above therefor.

Figure 5:
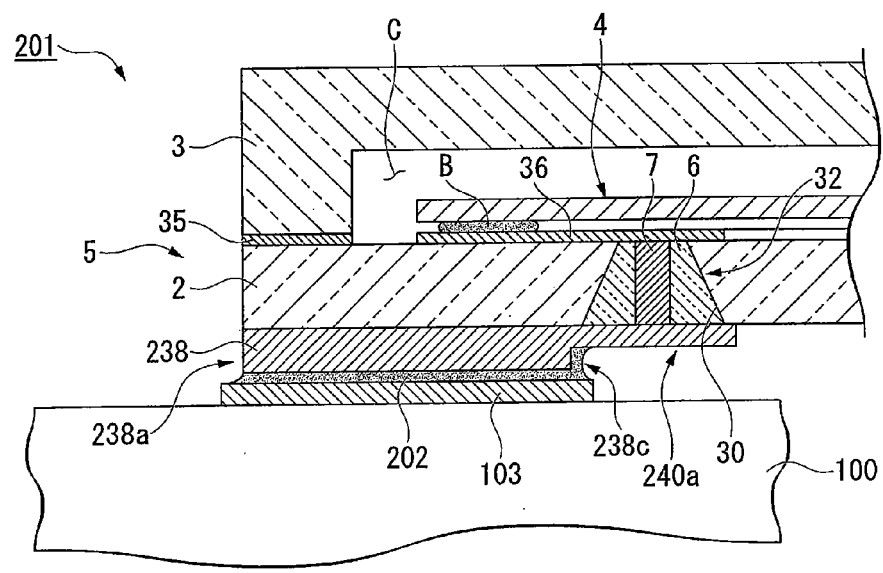
FIG. 5 is a side view showing a partial cross section of a piezoelectric vibrator mounting body according to a second embodiment of the invention.

FIG. 5 is a side view showing a cross section of a part of a structure of a piezoelectric vibrator mounting body 201 according to the second embodiment. As shown in FIG. 5, the piezoelectric vibrator mounting body 201 does not have the two-layer structure having the first layer 40 and the second layer 38 as in the first embodiment, but it has a different structure from the first embodiment in that the piezoelectric vibrator mounting body 201 has an electrode layer 238 that integrally forms an external electrode portion and a routing wiring portion using a same material.

An external electrode portion 238a and a routing wiring portion 240a are provided in the electrode layer 238. The external electrode portion 238a and the routing wiring portion 240a are formed of a material that has a high affinity for solder. For example, gold can be adopted as the material. Further, a stepped portion 238c corresponding to the stepped portion 38c of the first embodiment is a step that is formed as a result of forming the external electrode portion 238a and the routing wiring portion 240a while changing their respective thicknesses in the thickness direction of the base substrate 2.

In the embodiment, since both the external electrode portion 238a and the routing wiring portion 240a have a high affinity for a solder 202, when the land 103 and the external electrode portion 238a are connected by the solder 202, a part of the solder 202 spreads to the routing wiring portion 240a beyond the stepped portion 238c. However, due to surface tension of the solder 202, the solder 202 does not spread over an entire area of the routing wiring portion 240a and remains close to the stepped portion 238c.

Therefore, even with this type of structure, the transmission of the bending stress on the through electrode portion 32 via the solder 202 is inhibited, and it is possible to inhibit a crack from being caused by the concentration of the stress on the connecting part between the through electrode portion 32 and the base substrate 2. Further, since the routing wiring portion 240a is disposed apart from the wiring substrate 100 by at least the stepped portion 238c, similarly to the first embodiment, even when the wiring substrate is warped, the wiring substrate and the routing wiring portion are inhibited from making direct contact with each other.

Further, it is possible to simplify the structure since the external electrode portion 238c and the routing wiring portion 240a can be formed by the same material.

Third Embodiment

Piezoelectric Vibrator Manufacturing Method

Next, a piezoelectric vibrator manufacturing method of the invention will be explained with reference to FIG. 6. Note that descriptions will be omitted below for portions that have the same structures as those described above while using the same reference numerals and signs as above therefor.

Figure 6:
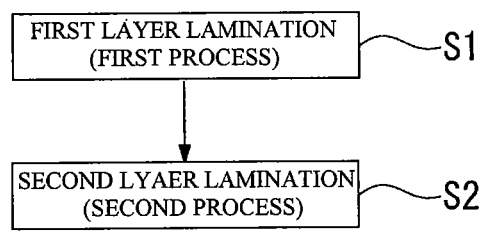
FIG. 6 is a flowchart showing a piezoelectric vibrator manufacturing method according to a third embodiment of the invention.

FIG. 6 is a flowchart showing a manufacturing method of the piezoelectric vibrator 1 of the first embodiment. As shown in FIG. 6, the piezoelectric vibrator manufacturing method according to the embodiment is provided with a first process S1 in which the routing wiring portion and a bottom layer of the external electrode portion are formed by laminating a first layer containing a first metal on a glass substrate such as the base substrate 2, for example, and a second process S2 in which an upper layer of the external electrode portion is formed by laminating a second layer containing a second metal on a surface of the bottom layer of the external electrode portion, the second metal having a higher affinity for solder than the first metal.

The first process S1 and the second process S2 can be performed by preferably selecting a method such as a sputtering method, a vacuum evaporation method, a photolithography method etc., for example. In the embodiment, a chromium layer containing chromium is formed as the first layer, and a gold layer containing gold is formed as the second layer. Note that the first layer may be formed solely by chromium and the second layer may be formed solely by gold.

According to the piezoelectric vibrator manufacturing method of the embodiment, since the routing wiring portion and the bottom layer of the external electrode portion are integrally formed by the first metal, they are physically connected to each other in a reliable manner and electrical resistance is reduced. Further, since the second layer laminated on the surface of the bottom layer of the external electrode portion has a high affinity for solder, it is possible to establish a connection by solder in a reliable manner. In addition, since the first layer and the second layer have a structure in which they are laminated to each other while covering an entire area of the second layer, the strong connection between the first layer and the second layer inhibits physical delamination, and it is possible to increase the mechanical strength of the piezoelectric vibrator.

Hereinabove, the embodiments of the invention are described in detail with reference to the drawings. However, specific structures are not limited to the embodiments, and design modifications and the like that do not depart from the spirit of the invention are also included.

For example, although the structure in which the routing wiring portion contains chromium and the external electrode portion contains gold is adopted in the respective embodiments of the invention, the structure is not limited to this and a structure in which the external electrode portion contains nickel or copper can also be adopted. Further, the external electrode portion is not limited to metal, and an electrically conductive resin material etc. can also be used. Even with this type of structure, the same effect can be achieved as the invention.

Further, although the structure in which the through electrode portion is disposed in the central part of the base substrate is adopted in the embodiment, as other positional relationships, a positional relationship can also be adopted in which the external electrode portion is disposed close to the center of a base electrode and the through electrode portions are disposed at both ends of the base substrate. In this case, when the piezoelectric vibrator is mounted on the wiring substrate, an area around the center of the package is fixed to the wiring substrate, and a positional relationship is obtained in which both ends of the package are positioned having a clearance with the wiring substrate. Therefore, even when the bending stress arises in the wiring substrate, only a section between the external electrode portions is warped in the package, and the bending stress is not transmitted to an area in which the through electrode portions are disposed. This produces an effect that can inhibit a crack from occurring in the through electrode portions.

Since it is possible to inhibit a crack of a through electrode portion caused by an external force such as a bending force that arises in a wiring substrate, the invention can be preferably applied in a case in which airtightness in a cavity is required even under an environment in which bending stress arises in the wiring substrate.

What is claimed is:

1. A piezoelectric vibrator comprising:
a package including a first substrate and a second substrate bonded to each other and defining a cavity therebetween;
an internal electrode portion on the first substrate and housed in the cavity;
piezoelectric vibrating reed sealed in the cavity and electrically connected to the internal electrode portion in the cavity by a bump connection;
an external electrode portion on an external surface of the first substrate, the external electrode portion including a metal having a high solder affinity;
a through electrode portion that is not overlapped by the bump connection or by the external electrode portion in a thickness direction of the first substrate, one end of the through electrode portion electrically connected to the internal electrode portion and another end of the through electrode portion on the external surface of the first substrate and penetrating through the first substrate; and a routing wiring portion electrically connecting the through electrode portion and the external electrode portion, the routing wiring portion including a metal having a low solder affinity relative to the external electrode portion.

2. The piezoelectric vibrator according to claim 1 further comprising:

a plurality of the external electrode portions, wherein the through electrode portion is disposed between the plurality of external electrode portions.

3. The piezoelectric vibrator according to claim 1 further comprising a stepped portion between the external electrode portion and the routing wiring portion, and wherein a maximum dimension in the thickness direction of the first substrate in the external electrode portion is larger than a maximum dimension in the thickness direction of the first substrate in the routing wiring portion.

4. The piezoelectric vibrator according to claim 1 further comprising:

a high solder affinity portion on a surface of the external electrode portion, and a low solder affinity portion having a lower affinity for the solder than the high solder affinity portion on a surface of the routing wiring portion.

5. The piezoelectric vibrator according to claim 4, wherein the low affinity portion comprises a chromium layer on the first substrate and including areas of the external electrode portion and the routing wiring portion, and wherein the high affinity portion comprises a gold layer layered over the chromium layer in the area of the external electrode portion.

6. A piezoelectric vibrator mounting body, comprising:

the piezoelectric vibrator according to claim 1 and a wiring substrate that includes a land electrically connected to the external electrode portion, wherein a surface area of the external electrode portion is smaller than a surface area of the land.

7. The piezoelectric vibrator according to claim 1, wherein the through electrode portion comprises a conical opening in the first substrate, and wherein the conical opening is occupied by a case that surrounds an electrically conductive core portion.

8. The piezoelectric vibrator according to claim 7, wherein the conical opening has a first diameter at a surface of the first substrate in contact with the routing wiring portion and a second diameter at a surface of the first substrate in contact with the internal electrode portion, and wherein the first diameter is greater than the second diameter.

9. The piezoelectric vibrator according to claim 7, wherein the case comprises a glass frit.

* * * * *